United States Patent [19]
Koike

[11] Patent Number: 4,554,465
[45] Date of Patent: Nov. 19, 1985

[54] 4-PHASE CLOCK GENERATOR

[75] Inventor: Hideharu Koike, Yokohama, Japan

[73] Assignee: Tokyo Shibaura Denki Kabushiki Kaisha, Japan

[21] Appl. No.: 565,653

[22] Filed: Dec. 27, 1983

[30] Foreign Application Priority Data

Dec. 27, 1982 [JP] Japan ................................ 57-234055

[51] Int. Cl.$^4$ ........................ H03K 3/037; H03K 5/15
[52] U.S. Cl. .................................. 307/269; 307/480;
307/291; 328/62; 328/63
[58] Field of Search ................. 307/443, 448, 451–453,
307/480–481, 582, 583, 269, 291; 328/62, 63,
74, 106, 130.1, 75

[56] References Cited

U.S. PATENT DOCUMENTS

| | | | |
|---|---|---|---|
| 3,448,295 | 6/1969 | Wanlass | 328/62 X |
| 3,740,660 | 6/1973 | Davies, Jr. | 328/62 X |
| 3,961,269 | 6/1976 | Alvarez, Jr. | 328/62 |
| 4,230,951 | 10/1980 | Suzuki et al. | 307/269 X |
| 4,283,639 | 8/1981 | Roesler | 328/62 X |
| 4,420,696 | 12/1983 | Gemma et al. | 307/480 X |
| 4,463,440 | 7/1984 | Nishiura et al. | 307/269 X |

OTHER PUBLICATIONS

Cordaro et al., "Programmable On-Chip Clock Generator", IBM Tech Disc Bull, vol. 17, No. 4, Sep. 1974, pp. 1051-1052.

Rauf, "Unclocked Sequence Generator", IBM Tech Disc Bull, vol. 18, No. 1, Jun. 1975, pp. 182-183.

Grunbok et al., "Double Pulse Generator", IBM Tech Disc Bull, vol 20, No. 1, Jun. 1977, pp. 200-201.

Howes et al., "Large Scale Integration", Wiley, pp. 156-158, 1981.

Primary Examiner—Stanley D. Miller
Assistant Examiner—D. R. Hudspeth
Attorney, Agent, or Firm—Finnegan, Henderson, Farabow, Garrett & Dunner

[57] ABSTRACT

A 4-phase clock generator comprises four gates for generating four clock signals from a master clock signal. The logic levels of four clock signals change in predetermined order after the master clock signal changes from a first logic level to a second logic level and they change in inverse order after the master clock signal changes back to the first logic level. The four clock signals are suitable to operate a shift register without making the adjoining transfer gates of the shift register conductive simultaneously.

11 Claims, 10 Drawing Figures

4-PHASE CLOCK GENERATOR

BACKGROUND OF THE INVENTION

Shift registers comprising a series of inverters separated by transfer gates are used in a large number of applications. When a transfer gate is made of a pair of P-channel and N-channel MOS FETs connected in parallel, clock signals $\phi$ and $\bar{\phi}$ are applied to gate electrodes of the MOS FETs of the transfer gate to control the shift of information.

It is usual that the clock signal $\bar{\phi}$ is generated by inverting the master clock signal $\phi$. The inversion operation takes a short time, and after the master clock signal $\bar{\phi}$ becomes a logic "1" or "0", there is only a short delay time before the clock signal $\bar{\phi}$ becomes a logic "0" or "1".

Consequently the levels of clock signals $\phi$ and $\bar{\phi}$ are a logic "1" or "0" substantially simultaneously, and all transfer gates become conductive. Therefore the information applied to the input of the shift register passes through to the output. This is called "race hazards" or "racing".

SUMMARY OF THE THE INVENTION

It is an object of this invention to provide a 4-phase clock generator which outputs clock signals having desired waveforms.

It is another object of this invention to provide a 4-phase clock generator which generates clock signals synchronized to the master clock signal.

It is a further object of this invention to provide a 4-phase clock generator for outputting clock signals whose waveforms are suitable to control a shift register.

According to the invention a 4-phase clock generator for producing four clock signals synchronized to a master clock signal comprises, a first gate having first and second inputs and an output for outputting a first clock signal, a second gate having first, second and third inputs and an output for outputting a second clock signal, the first input of the second gate being connected to the output of the first gate and the output of the second gate being connected to the second input of the first gate, a third gate having first, second and third inputs and an output for outputting a third clock signal, the first input of the third gate being connected to the output of the second gate and the output of the third gate being connected to the third input of the second gate, and a fourth gate having first and second inputs and an output for outputting a fourth clock signal, the first input of the fourth gate being connected to the output of the third gate, the output of the fourth gate being connected to the third input of the third gate, the master clock signal being inputted to the first input of the first gate and to the second inputs of the second, third and fourth gates and the logic levels of the first through fourth clock signals changing sequentially with time, each lagging behind the change of the previous signal.

DETAILED DESCRIPTION

Figure 1:
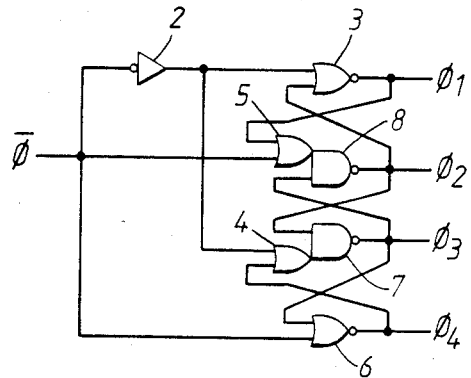
FIG. 1 is a logic diagram of a preferred embodiment of this invention.

Referring now to the drawings, there is shown in FIG. 1 a logic diagram of a 4-phase clock generator in accordance with the present invention for outputting clock signals $\phi_1$, $\phi_2$, $\phi_3$ and $\phi_4$ synchronized with the master clock signal $\phi$.

The master clock signal $\bar{\phi}$ is inputted to a NOR gate 3 and an OR gate 4 through an inverter 2 and is also inputted to an OR gate 5 and a NOR gate 6. The NOR gates 3 and 6 output clock signals $\phi_1$ and $\phi_4$ respectively. The clock signal $\phi_1$ is inputted to the OR gate 5, the output of which is received by a NAND gate 8. The clock signal $\phi_4$ is inputted to the OR gate 4, the output of which is received by a NAND gate 7. The NAND gates 7 and 8 output respectively clock signals $\phi_3$ and $\phi_2$. The clock signal $\phi_2$ is inputted to the NOR gate 3 and the NAND gate 7. The clock signal $\phi_3$ is inputted to the NAND gate 8 and the NOR gate 6.

In this embodiment, the NOR gates 3 and 6 form first gate and fourth gate means respectively. The OR gate 5 and the NAND gate 8 form a second gate means and the OR gate 4 and the NAND gate 7 form a third gate means. Clock signals $\phi_1$, $\phi_2$, $\phi_3$ and $\phi_4$ are first, second, third and fourth clock signals respectively.

The logic equations of clock signals $\phi_1$ to $\phi_4$ are as follows.

$$\phi_1 = \overline{\bar{\phi} + \phi_2}$$

$$\phi_2 = \overline{(\phi + \bar{\phi}) \cdot \phi_3}$$

$$\phi_3 = \overline{(\phi_4 + \phi) \cdot \phi_2}$$

$$\phi_4 = \overline{\phi_3 + \bar{\phi}}$$

Figure 2:
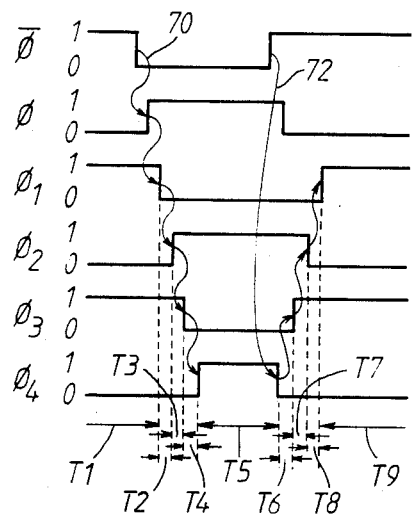
FIG. 2 is a waveform illustrating the operation of the circuit shown in FIG. 1.

Referring now to FIGS. 1 and 2, when the master clock signal $\bar{\phi}$ is a logic "1", the second NOR gate 6 outputs a logic "0" without reference to the logic level of the clock signal $\phi_3$. The second OR gate 4 receives the inverted master clock signal $\phi$ and the clock signal $\phi_4$ and the logic levels of $\phi$ and $\phi_4$ are both "0". Therefore the second OR gate 4 outputs "0". The second NAND gate 7 receives "0" and outputs "1" without reference to the logic level of the clock signal $\phi_2$. The first OR gate 5 receives the master clock signal $\bar{\phi}$ whose logic level is "1" and outputs "1". The first NAND gate 8 receives the output "1" of the first OR gate 5 and the clock signal $\phi_3$, "1", therefore the first NAND gate 8 outputs "0". The first NOR gate 3 receives the inverted master clock signal $\phi$ and the clock signal $\phi_2$ and the logic levels of $\phi$ and $\phi_2$ are both "0", therefore the first NOR gate 3 outputs "1".

After the master clock signal $\bar{\phi}$ changes from a logic "1" to a logic "0", the inverted master clock signal $\phi$ changes from "0" to "1". Then $\phi_1$ turns into "0", that makes $\phi_2$ turn into "1". And then $\phi_3$ turns into "0", that makes $\phi_4$ turn into "1".

When $\bar{\phi}$ changes from "0" to "1", $\phi_4$ turns into "0", that makes $\phi_3$ turn into "1". Then $\phi_2$ turns into "0", and that makes $\phi_1$ turn into "1".

The levels of $\phi_1$, $\phi_2$, $\phi_3$ and $\phi_4$ change in the above order as shown by line 90 after the logic level of $\bar{\phi}$ changes from "1" to "0", and the logic levels of $\phi_1$, $\phi_2$, $\phi_3$ and $\phi_4$ change in inverse order as shown by line 72 after the logic level of $\phi$ changes from "0" to "1".

Figure 3:
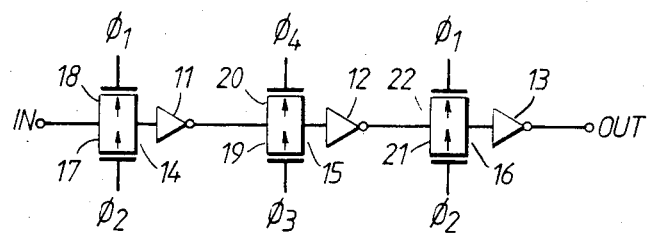
FIG. 3 is a circuit showing a shift register.

Referring now to FIG. 3, there is shown a shift register comprising a series of inverters 11, 12 and 13 separated by transfer gates 14, 15 and 16. The transfer gates 14 and 16 are made of a P-channel MOS FET 17 and a N-channel MOS FET 18 connected in parallel and a P-channel MOS FET 21 and a N-channel MOS FET 22 connected in parallel, respectively. The transfer gate 15 is made of a P-channel MOS FET 19 and a N-channel MOS FET 20 connected in parallel. Clock signals $\phi_1$ and $\phi_2$ are applied to gate electrodes of the N-channel MOS FETs 18 and 22 and the P-channel MOS FETs 17 and 21 respectively. Clock signals $\phi_3$ and $\phi_4$ are applied to gate electrodes of the P-channel MOS FET 19 and the N-channel MOS FET 20 respectively.

The behavior of the transfer gates 14, 15 and 16 in each time period of $T_1$ through $T_9$ shown in FIG. 2 are as follows.

$T_1$:$\phi_1$ is "1" and $\phi_2$ is "0", therefore the transfer gates 14 and 16 are conductive. $\phi_3$ is "1" and $\phi_4$ is "0", therefore the transfer gate 15 is nonconductive.

$T_2$:$\phi_1$ is "0", then the N-channel MOS FETs 18 and 22 are nonconductive.

$T_3$:$\phi_2$ is "1", then the P-channel MOS FETs 17 and 21 are nonconducting and the transfer gates 14 and 16 are nonconductive. Therefore in this period, all transfer gates 14, 15 and 16 are nonconductive.

$T_4$:$\phi_3$ is "0", then the P-channel MOS FET 19 is conductive.

$T_5$:$\phi_4$ is "1", then the N-channel MOS FET 20 is conductive. Therefore in this period the transfer gate 15 is conductive and the transfer gates 14 and 16 are nonconductive.

$T_6$:$\phi_4$ is "0", then the N-channel MOS FET 20 is nonconductive.

$T_7$:$\phi_3$ is "1", then the P-channel MOS FET 19 is nonconductive and the transfer gate 15 is nonconductive. Therefore in this period all transfer gates 14, 15 and 16 are nonconductive.

$T_8$:$\phi_2$ is "0", then the P-channel MOS FETs 17 and 21 are conductive.

$T_9$:$\phi_1$ is "1", then the N-channel MOS FETs 18 and 22 are conductive. Therefore in this period, the transfer gates 14 and 16 are conductive and the transfer gate 15 is nonconductive.

The shift register transfers information applied to the input IN to the output OUT by conduction from one to the next adjoining transfer gates one after the other. The information applied to input IN during $T_1$ is transferred to the input of the transfer gate 15 and is transferred to the input of the transfer gate 16 during $T_4$, $T_5$ and $T_6$, then it is outputted from output OUT during $T_8$ and $T_9$. All transfer gates are nonconductive during $T_3$ and $T_7$, and all transfer gates do not become conductive at the same time. Therefore the information applied to input IN is transferred to the output OUT synchronized to the master clock signal and race hazards never can occur in this shift register.

Figure 4:
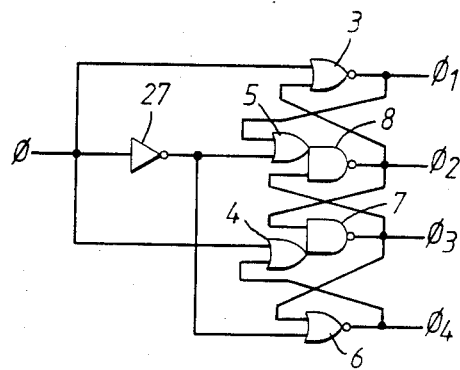
FIGS. 4, 6 and 8 are logic diagrams showing other embodiments of this invention.
Figure 5:
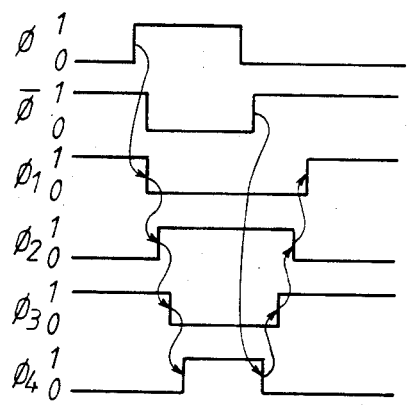
FIGS. 5, 7 and 9 are waveforms illustrating the operations of circuits shown in FIGS. 4, 6 and 8 respectively.

Referring now to FIG. 4, there is shown a third embodiment of this invention. The master clock signal $\phi$ is inputted to a NOR gate 3 and an OR gate 4, and the master clock signal $\phi$, inverted by an inverter 27, i.e. $\overline{\phi}$, is inputted to a OR gate 5 and a NOR gate 6. Other components are the same as the embodiment shown in FIG. 1. The waveforms of this circuit are shown in FIG. 5. The waveforms of clock signals $\phi_1$ through $\phi_4$ are the same as those shown in FIG. 2.

Figure 6:
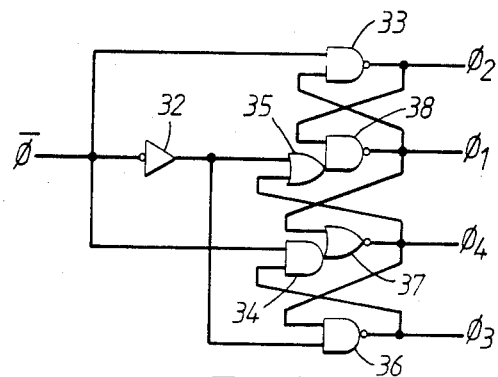

Referring now to FIG. 6, there is shown a fourth embodiment of this invention. A master clock signal $\overline{\phi}$ is inputted to a NAND gate 33, which outputs a clock signal $\phi_2$, and to an AND gate 34. The inverted master clock signal $\phi$, inverted by an inverter 32, is inputted to an OR gate 35 and a NAND gate 36 which outputs a clock signal $\phi_3$. A NAND gate 38 receives the clock signal $\phi_2$ and the output of the OR gate 35, and outputs a clock signal $\phi_1$ which is inputted to the NAND gate 33. The NOR gate 27 receives the clock signal $\phi_1$ and the output of the AND gate 34, and outputs a clock signal $\phi_4$ which is inputted to the OR gate 35 and the NAND gate 36. The clock signal $\phi_3$ is inputted to the AND gate 34.

In the embodiment of FIG. 6, the NAND gates 33 and 36 form a first and a fourth gate means respectively. The OR gate 35 and the NAND gate 38 form a second gate means. The AND gate 34 and the NOR gate 37 form a third gate means. Clock signals $\phi_2$, $\phi_1$, $\phi_4$ and $\phi_3$ are first, second, third and fourth clock signals respectively.

The logic equation of clock signals $\phi_1$ through $\phi_4$ are as follows.

$$\phi_1 = \overline{\phi_2 \cdot (\phi + \phi_4)}$$

$$\phi_2 = \overline{\overline{\phi} \cdot \phi_1}$$

$$\phi_3 = \overline{\phi \cdot \phi_4}$$

$$\phi_4 = \overline{\phi_1 + (\overline{\phi} \cdot \phi_3)}$$

Figure 7:
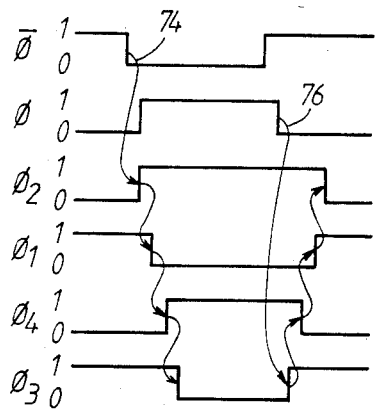

Referring now to FIG. 7, after the master clock signal $\overline{\phi}$ changes from a logic "1" to a logic "0", the logic levels of clock signals $\phi_2$, $\phi_1$, $\phi_4$, $\phi_3$ change in that same order as shown by line 74. After the master clock signal $\overline{\phi}$ changes from a logic "0" to a logic "1", the logic levels of clock signals $\phi_3$, $\phi_4$, $\phi_1$ and $\phi_2$ change in that order as shown by line 76.

Figure 8:
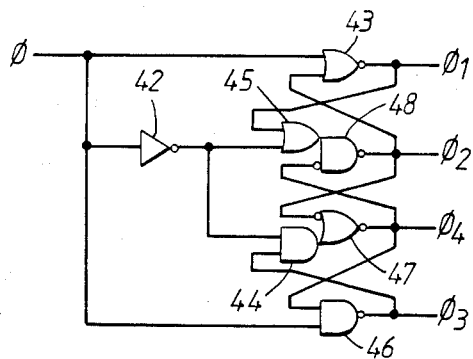

Referring now to FIG. 8, there is shown a fifth embodiment of this invention. A master clock signal $\phi$ is inputted to a NOR gate 43 which outputs a clock signal $\phi_1$, an inverter 42 which outputs an inverted master clock signal $\overline{\phi}$ and to a NAND gate 46 which outputs a clock signal $\phi_3$. An OR gate 45 receives the clock signal $\phi_1$ and the inverted master clock signal $\overline{\phi}$. An AND gate 44 receives the clock signal $\phi_3$ and the inverted master clock signal $\phi$. A NAND gate 48 receives the output of the OR gate 45 and outputs a clock signal $\phi_2$ which is inputted to the NOR gate 43. The NOR gate 47 receives a clock signal generated by inverting the clock signal $\phi_2$ and the output of the AND gate 44, and outputs a clock signal $\phi_4$. The clock signal $\phi_4$ is inputted to the NAND gate 46 and a clock signal generated by inverting the clock signal $\phi_4$ is inputted to the NAND gate 48.

In this embodiment, a first gate means and a fourth gate means comprise the NOR gate 43 and the NAND gate 46 respectively. A second gate means comprises the OR gate 45 and the NAND gate 48. A third gate means comprises the AND gate 44 and the NOR gate 47. Clock signals $\phi_1$, $\phi_2$, $\phi_4$ and $\phi_3$ are first, second, third and fourth clock signals respectively.

The logic equations of clock signals $\phi_1$ through $\phi_4$ are as follows.

$$\phi_1 = \overline{\phi + \phi_2}$$

$$\phi_2 = \overline{(\overline{\phi + \phi_1}) \cdot \phi_4}$$

$$\phi_3 = \overline{\overline{\phi} + \phi_4}$$

$$\phi_4 = \overline{\overline{\phi_2} + (\overline{\phi} \cdot \phi_3)}$$

Figure 9:
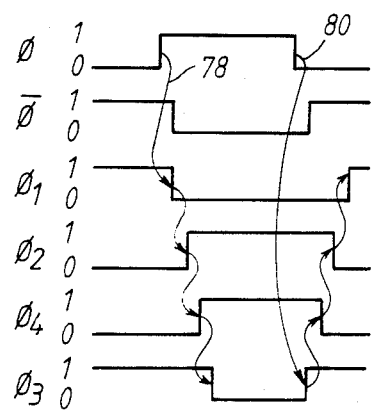

Referring now to FIG. 9, after the master clock signal $\phi$ changes from a logic "0" to a logic "1", the logic levels of clock signals $\phi_1$, $\phi_2$, $\phi_4$ and $\phi_3$ change in that order as shown by line 78. After the master clock signal $\phi$ changes from a logic "1" to a logic "0", the logic levels of clock signals $\phi_3$, $\phi_4$, $\phi_2$ and $\phi_1$ change in that order as shown by line 80.

Figure 10:
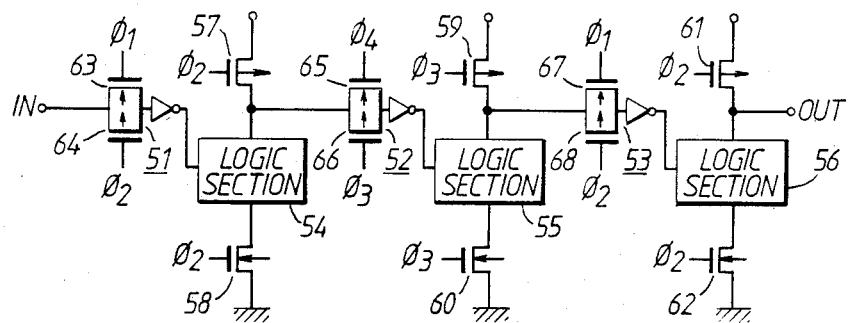
FIG. 10 is a logic diagram showing a dynamic logic circuit made of complementary MOS FETs.

Referring now to FIG. 10, there is shown a dynamic logic circuit made of complementary MOS FETs and using 4-phase clock signals. Logic sections made of N-channel MOS FETs 54, 55 and 56 have at least three terminals respectively and perform such logic operations as "NOT", "NAND" and "NOR". Transfer gates 51, 52 and 53 consist of pairs of N-channel and P-channel MOS FETs 63 and 64, 65 and 66, and 67 and 68 respectively. The transfer gate 51 is connected between the first terminal of the logic section 54 and an input "IN". P-channel MOS FETs 57, 59 and 61 are connected to the second terminal of logic sections 54, 55 and 56 respectively. N-channel MOS FETs 58, 60 and 62 are connected to the third terminal of logic sections 54, 55 and 56 respectively. The transfer gate 52 is connected between the second terminal of the logic section 54 and the first terminal of the logic section 55. The transfer gate 53 is connected between the second terminal of the logic section 55 and the first terminal of the logic section 56, the second terminal of which is an output "OUT".

The 4-phase clock generator shown in FIG. 1 is used to operate this dynamic logic circuit. The clock signal $\phi_1$ is applied to gate electrodes of N-channel MOS FETs 63 and 67. The clock signal $\phi_2$ is applied to gate electrodes of P-channel MOS FETs 57, 61, 64 and 68 and the gate electrodes of N-channel MOS FETs 58 and 62. The clock signal $\phi_3$ is applied to gate electrodes of P-channel MOS FETs 59 and 66 and to the gate electrode of the N-channel MOS FET 60. The clock signal $\phi_4$ is applied to the gate electrode of the N-channel MOS FET 65.

The information applied to the input "IN" while the transfer gate 51 is conductive is transferred to the logic section 54, the output of which is fixed when the clock signal $\phi_2$ becomes a logic "1". The output of the logic section 54 is transferred to the logic section 55 when the transfer gate 52 becomes conductive. The output of the logic section 55 is fixed when the clock signal $\phi_3$ becomes a logic "1". The output of the logic section 55 is transferred to the logic section 56 when the transfer gate 53 becomes conductive. The output of the logic section 56 is fixed when the clock signal $\phi_2$ becomes a logic "1".

The clock signals $\phi_1$ and $\phi_4$ are used only to operate the transfer gates. The clock signals $\phi_2$ and $\phi_3$ are used not only to operate the transfer gates, but also to precharge and discharge the logic sections. Namely the clock signals control logic operations and the shifting of results of logic operations. After the output of a certain logic section is fixed, the transfer gate connected to the second terminal of the certain logic section becomes conductive and the output of the certain logic section is transferred to the next logic section.

While this invention has been described with reference to illustrative embodiments, this description is not intended to be construed in a limiting sense. Various modifications of the embodiments will be apparent to persons skilled in the art upon reference to this description. It is, therefore contemplated that the appended claims will cover any such modifications or embodiments as fall within the true scope of the invention.

What is claimed is:

1. A 4-phase clock generator for producing four clock signals responsive to first and second master clock signals comprising:

first gate means having first and second inputs and an output for outputting a first clock signal;

second gate means having first, second and third inputs and an output for outputting a second clock signal, the first input of the second gate means being connected to the output of the first gate means and the output of the second gate means being connected to the second input of the first gate means;

third gate means having first, second and third inputs and an output for outputting a third clock signal, the first input of the third gate means being connected to the output of the second gate means and the output of the third gate means being connected to the third input of the second gate means; and fourth gate means having first and second inputs and an output for outputting a fourth clock signal, the first input of the fourth gate means being connected to the output of the third gate means, the output of the fourth gate means being connected to the third input of the third gate means; and said first master clock signal being inputted to the first input of the first gate means and to the second input of the third gate means, said second master clock signal being complementary to the first master clock signal and being inputted to the second inputs of the second and fourth gate means, the logic levels of first, second, third and fourth clock signals changing in sequential order after the first master clock signal changes from a first logic level to a second logic level and after the second master clock signal changes from the second logic level to the first logic level and the logic levels of first, second, third and fourth clock signals changing in reverse sequential order after the first master clock signal changes from the second logic level to the first logic level and after the second master clock signal changes from the first logic level to the second logic level.

2. A 4-phase clock generator for producing four clock signals responsive to first and second master clock signals comprising:

first gate means having first and second inputs and an output for outputting a first clock signal;

second gate means having first, second and third inputs and an output for outputting a second clock signal, the first input of the second gate means being connected to the output of the first gate means and the output of the second gate means being connected to the second input of the first gate means;

third gate means having first, second and third inputs and an output for outputting a third clock signal, the first input of the third gate means being connected to the output of the second gate means and the output of the third gate means being connected to the third input of the second gate means;

fourth gate means having first and second inputs and an output for outputting a fourth clock signal, the first input of the fourth gate means being connected to the output of the third gate means, the output of the fourth gate means being connected to the third input of the third gate means; and said first master clock signal being inputted to the second inputs of the second and third gate means, said second master clock signal being complementary to the first master clock signal and being inputted to the first input of the first gate means and to the second input of the fourth gate means, the logic levels of first, second, third and fourth clock signals changing in that order after the first master clock signal changes form a first logic level to a second logic level and after the second master clock signal changes from the second logic level to the first logic level and the logic levels of fourth, third, second and first clock signals changing in that order after the first master clock signal changes from the second logic level to the first logic level and after the second master clock signal changes from the first logic level to the second logic level.

3. A 4-phase clock generator according to claim 1 wherein:

the first gate means comprises a first NOR gate for receiving the first master clock signal and the second clock signal and for outputting the first clock signal;

the second gate means comprises a first OR gate for receiving the second master clock signal and the first clock signal and a first NAND gate for receiving the output of the first OR gate and the third clock signal and for outputting the second clock signal;

the third gate means comprises a second OR gate for receiving the first master clock signal and the fourth clock signal and a second NAND gate for receiving the output of the second OR gate and the second clock signal and for outputting the third clock signal; and the fourth gate means comprises a second NOR gate for receiving the third clock signal and the second master clock signal and for outputting the fourth clock signal.

4. A 4-phase clock generator according to claim 1 wherein:

the first gate means comprises a first NAND gate for receiving the first master clock signal and the second clock signal and for outputting the first clock signal;

the second gate means comprises an OR gate for receiving the second master clock signal and the third clock signal and a second NAND gate for receiving the output of the OR gate and the first clock signal and for outputting the second clock signal;

thie third gate means comprises an AND gate for receiving the first master clock signal and the fourth clock signal and a NOR gate for receiving the output of the AND gate and the second clock signal and for outputting the clock signal; and the fourth gate means comprises a third NAND gate for receiving the second master clock signal and the third clock signal and for outputting the fourth clock signal.

5. A 4-phase clock generator according to claim 2 wherein:

the first gate means comprises a first NOR gate for receiving the first master clock signal and the second clock signal and for outputting the first clock signal;

the second gate means comprises an OR gate for receiving the second master clock signal and the first clock signal and a first NAND gate for receiving the output of the OR gate and an inverted third clock signal and for outputting the second clock signal;

the third gate means comprises an AND gate for receiving the second master clock signal and the fourth clock signal and a second NOR gate for receiving the output of the AND gate and an inverted second clock signal and for outputting the third clock signal; and the fourth gate means comprises a second NAND gate for receiving the first master clock signal and the third clock signal and for outputting the fourth clock signal.

6. A 4-phase clock generator according to claim 3 wherein the second master clock signal is generated by inverting the first master clock signal.

7. A 4-phase clock generator according to claim 4 wherein the second master clock signal is generated by inverting the first master clock signal.

8. A 4-phase clock generator according to claim 5 wherein the second master clock signal is generated by inverting the first master clock signal.

9. A 4-phase clock generator according to claim 3 wherein the first master clock signal is generated by inverting the second master clock signal.

10. A 4-phase clock generator according to claim 4 wherein the first master clock signal is generated by inverting the second master clock signal.

11. A 4-phase clock generator according to claim 5 wherein the first master clock signal is generated by inverting the second master clock signal.

* * * * *